(12) United States Patent
Gravati et al.

(10) Patent No.: US 8,884,654 B2
(45) Date of Patent: Nov. 11, 2014

(54) PEAK VOLTAGE DETECTOR AND RELATED METHOD OF GENERATING AN ENVELOPE VOLTAGE

(71) Applicant: STMicroelectronics S.r.l., Agrate Brianza (IT)

(72) Inventors: Mirko Gravati, Milan (IT); Claudio Cantoro, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/720,511

(22) Filed: Dec. 19, 2012

(65) Prior Publication Data
US 2013/0162297 A1 Jun. 27, 2013

(30) Foreign Application Priority Data
Dec. 22, 2011 (IT) .............................. MI2011A2346

(51) Int. Cl.
| H03K 5/153 | (2006.01) |
| H03K 5/1532 | (2006.01) |
| G01R 19/04 | (2006.01) |

(52) U.S. Cl.
CPC .............. G01R 19/04 (2013.01); H03K 5/1532 (2013.01)
USPC .................. 327/58; 327/534; 327/72; 327/87; 327/50

(58) Field of Classification Search
USPC ..................................... 327/58, 534
See application file for complete search history.

(56) References Cited

U.S. PATENT DOCUMENTS

| 4,086,651 | A |   | 4/1978 | Muir et al. |          |
| 4,445,093 | A | * | 4/1984 | Kohler    | 327/58   |
| 4,987,323 | A |   | 1/1991 | Fujita    |          |
| 5,302,863 | A | * | 4/1994 | Walley et al. | 327/60 |
| 5,757,210 | A | * | 5/1998 | Sanzo     | 327/63   |
| 6,215,334 | B1 | * | 4/2001 | Pernyeszi | 327/73  |
| 6,512,399 | B1 | * | 1/2003 | DeGeronimo et al. | 327/62 |
| 7,239,120 | B2 |   | 7/2007 | Adragna et al. |   |
| 2008/0143435 | A1 | * | 6/2008 | Wilson et al. | 329/342 |
| 2011/0121659 | A1 |   | 5/2011 | Cheng et al. |    |

FOREIGN PATENT DOCUMENTS

DE 3640074 A1 5/1987

OTHER PUBLICATIONS

Maaspuro, M. et al., "JFET improves peak detector's accuracy," EDN—Electrical Design News 38(8), pp. 195, Apr. 15, 1993.

* cited by examiner

*Primary Examiner* — Lincoln Donovan
*Assistant Examiner* — Patrick Chen
(74) *Attorney, Agent, or Firm* — Seed IP Law Group PLLC

(57) ABSTRACT

A peak detector circuit receives an oscillating power supply signal. A capacitor is selectably coupled to the signal and charged to a value corresponding to a peak value of the signal. A switch is then opened to isolate the capacitor. A comparator continually compares the signal with the value stored on the capacitor. When the signal rises to within a selected threshold, relative to the stored value, the comparator produces a command signal to close the switch, again coupling the capacitor to the signal. The peak detector can also include a tracking circuit that controls the capacitor to track the oscillating signal while the switch is closed, a timer circuit configured to close the switch and activate the tracking circuit if more than a selected time passes without production of a command signal, and a circuit configured to control the polarity of a leakage current of the capacitor.

12 Claims, 10 Drawing Sheets

PEAK VOLTAGE DETECTOR AND RELATED METHOD OF GENERATING AN ENVELOPE VOLTAGE

BACKGROUND

1. Technical Field

This disclosure relates to detectors of voltage peaks of oscillating signals and more particularly to a novel architecture, realizable in a completely integrated form, adapted to generate an envelope voltage corresponding to the instantaneous peak value of an input oscillating voltage and to a related method.

2. Description of the Related Art

Forced switching power supplies and, more particularly, systems for active power factor correction (PFC), store information about peak values of an input voltage, that typically is the voltage of the mains, thus at a low frequency.

In general, PFC pre-regulators are switching converters controlled such to obtain a regulated DC output voltage from an input AC voltage. Using particular switching techniques, PFC regulators are capable of absorbing a sinusoidal current in phase with the voltage of the mains, thus obtaining in this way a power factor close to 1 and a reduced total harmonic distortion of the current absorbed from the mains.

FIG. 1 is an example of a known PFC pre-regulator with a "Transition Mode" control.

The amplifier VA compares a fraction of the output voltage with an internal reference voltage VREF for generating an error signal that is sent to the multiplier.

The multiplier MULTIPLIER carries out the product between a fraction of the mains voltage and the output signal of the amplifier VA, thus outputting a sinusoidal signal in phase with the mains voltage and having an amplitude proportional to the error signal itself.

The PWM comparator compares the signal generated by the multiplier with a value proportional to the current flowing through the inductor L and turns off the power MOSFET M as soon as the two values match each other, thus determining the envelope of the current through the inductor itself.

Once the MOSFET M is off, the inductor L discharges through the load the energy stored during the previous phase. At this point, the MOSFET M is turned on again by the switching of the zero-cross comparator ZCD and the loop restarts.

The current absorbed from the mains, because of the input filter, will be the low-pass component of the current flowing throughout the inductor L, thus its mean value at each switching cycle, equal to one half of the envelope of the peaks and with a sinusoidal waveform in phase with the mains voltage itself, as shown in FIG. 2.

From an analysis of the functioning, it is evident that the gain of the power stage of a PFC pre-regulator depends with a quadratic law from the RMS value of the mains voltage. In case of fluctuations of the mains voltage, the error amplifier intervenes in an appropriate manner for bringing the sinusoidal reference (input to the PWM comparator) to the value that obtains a correct regulation of the output.

This quadratic function that ties the gain to the value of the input voltage causes the followings drawbacks:

the error amplifier has linear dynamics in a very extended range. In systems with a so-called universal supply the input voltage may vary by a factor 3 or more, thus the gain may vary by a factor 9. Therefore the error amplifier, for a same load, should be capable of reducing its output at least by nine times;

the quadratic variation of the gain implies a similar variation of the cut-off frequency of the open loop transfer function, with consequent difficulty of compensating the system and a relatively slow dynamical response when functioning at the maximum voltage. Indeed, the frequency response of the system has a single pole. This pole is independent from the input voltage and is tied to the resistance and to the capacitance on the output of the pre-regulator. Therefore, if the error amplifier is compensated for having a band of 20 Hz for the open loop transfer function at the maximum voltage, the band will be of about 2 Hz at the minimum mains voltage, thus causing an even slower dynamical response;

undershoots/overshoots of the output voltage of the pre-regulator, in response to great fluctuations of the mains voltage. With the same load, at each variation of the input voltage, in order to make the system remain regulated, there should be a corresponding opposite variation of the output of the error amplifier. The amplifier is relatively slow thus, before being capable of following and compensating the variation, output undershoots/overshoots may occur.

In order to compensate these phenomena, a compensation factor can be introduced, in the loop gain, which is inversely proportional to the square of the input voltage. This compensation technique, called "voltage feedforward", consists in deriving a voltage proportional to the RMS value of the input voltage, providing this value to a squaring/dividing circuit (corrector $1/V_{FF}^2$) and providing the resulting signal to the multiplier that generates the reference for the peak current of the system.

With this technique, a variation of the supply voltage causes a variation inversely proportional to the amplitude of the sinusoid generated by the multiplier; if the supply voltage doubles, the amplitude of the signal generated by the multiplier halves and vice versa. The reference for the peak current is, in this way, immediately adapted to the new working conditions without need of intervention of the error amplifier. The loop gain will remain constant for any value of the input voltage, thus sensibly improving the dynamical behavior of the pre-regulator. Moreover, the design of the external network for ensuring the stability of the system is simplified.

From the above considerations, the circuit for sensing the RMS value (peak detector) is fully effective if it is capable of following fluctuations of the input voltage in both directions. A fast detection of peaks may be insufficient when they increase but also when their value decreases. Indeed, if the detection of the peak reduction of the mains voltage is very slow, the setting of the correct feedforward action will be delayed, with a consequent excessive overshoot of the output voltage of the pre-regulator because of great variations of the supply voltage.

Commonly, as disclosed in U.S. Pat. No. 7,239,120, and employed in controller L6563 of STMicroelectronics, in order to obtain this function, a so-called integrated "ideal diode" is used, comprising an operational amplifier configured as voltage follower in the feedback path, with an external capacitor $C_{FF}$ for storing information and an external resistance $R_{FF}$ as shown in FIG. 3.

The resistance $R_{FF}$, properly determined, provides the discharge path of the capacitor and makes the system capable of adapting itself, with a time constant $R_{FF}C_{FF}$, to reductions of the root mean square value of the input voltage. The time constant $R_{FF}C_{FF}$ is determined such to make the discharge phenomenon not detectable inside each half period of the mains voltage; the RMS value of the mains voltage is thus close to a continuous value.

A drawback of this type of circuit, besides using two discrete external components, consists in that the system responds according to an exponential law with a time constant $R_{FF}C_{FF}$ that, for the reasons stated above, will be relatively great (typically in the order of several hundreds of ms). This implies a loss of effectiveness of the feedforward technique for a longer time the greater the variation of the input voltage and thus the greater the time constant $R_{FF}C_{FF}$.

A mains drop detector, shown in FIG. 4, used in the integrated control L6564 of STMicroelectronics, stores on an inner capacitance C1 the peak of a scaled replica of the mains voltage (excluding any voltage offset).

The voltage on this capacitance, called $V_{FFi}$, is used as threshold of a comparator that compares it with a peak voltage $V_{FF}$ (minus a voltage drop across a resistor $R_1$. The threshold and the external RC filter $R_{FF}C_{FF}$ are dimensioned such that, in a mains voltage period, the voltage $V_{FF}$ does not decrease sufficiently to switch the comparator. Should an abrupt decrease of the mains voltage occur, the voltage on the external capacitor $C_{FF}$, after a certain number of periods, drops below the threshold thus switching the comparator that, on its turn, turns on transistor M6 that acts as a fast discharge circuit of the capacitance $C_{FF}$, which will be charged with a new peak value.

BRIEF SUMMARY

According to one embodiment, a detector of voltage peak values adapted to generate an envelope voltage of an oscillating voltage is provided. The detector has an architecture realizable in a completely integrated form capable of keeping the information on the value of the last detected peak in an accurate fashion also in case of long periods of time between two consecutive peak events.

The detector has an integrated tank capacitor referred to a reference potential, on which a voltage representing the last detected peak value is made available. The capacitor is charged with the value of the oscillating voltage shortly before a peak event, and is disconnected from the remaining part of the circuit at the end of the event, in order to limit as much as possible leakage currents. A controlled switch is configured to connect the tank capacitor to a rectified replica of the oscillating voltage when the switch is closed and to isolate the capacitor from the oscillating voltage when the switch is open. A rectifying circuit is input with the oscillating voltage and generates the rectified replica voltage on an output coupled to the tank capacitor, through the controlled switch. The rectifying circuit is adapted to replicate the oscillating voltage on the output when the controlled switch is closed. A comparator is configured to compare an offset value corresponding to the envelope voltage stored on the capacitor, and the oscillating voltage, and to generate a command signal adapted to close the controlled switch when the difference voltage is smaller than the offset voltage.

According to a preferred embodiment, the time elapsed from the last detected active switching edge of the command signal is measured and the controlled switch is closed when the command signal is active or when a pre-established time interval has elapsed from the last active switching edge of the command signal, and the control switch is opened otherwise.

DETAILED DESCRIPTION

Figure 1:
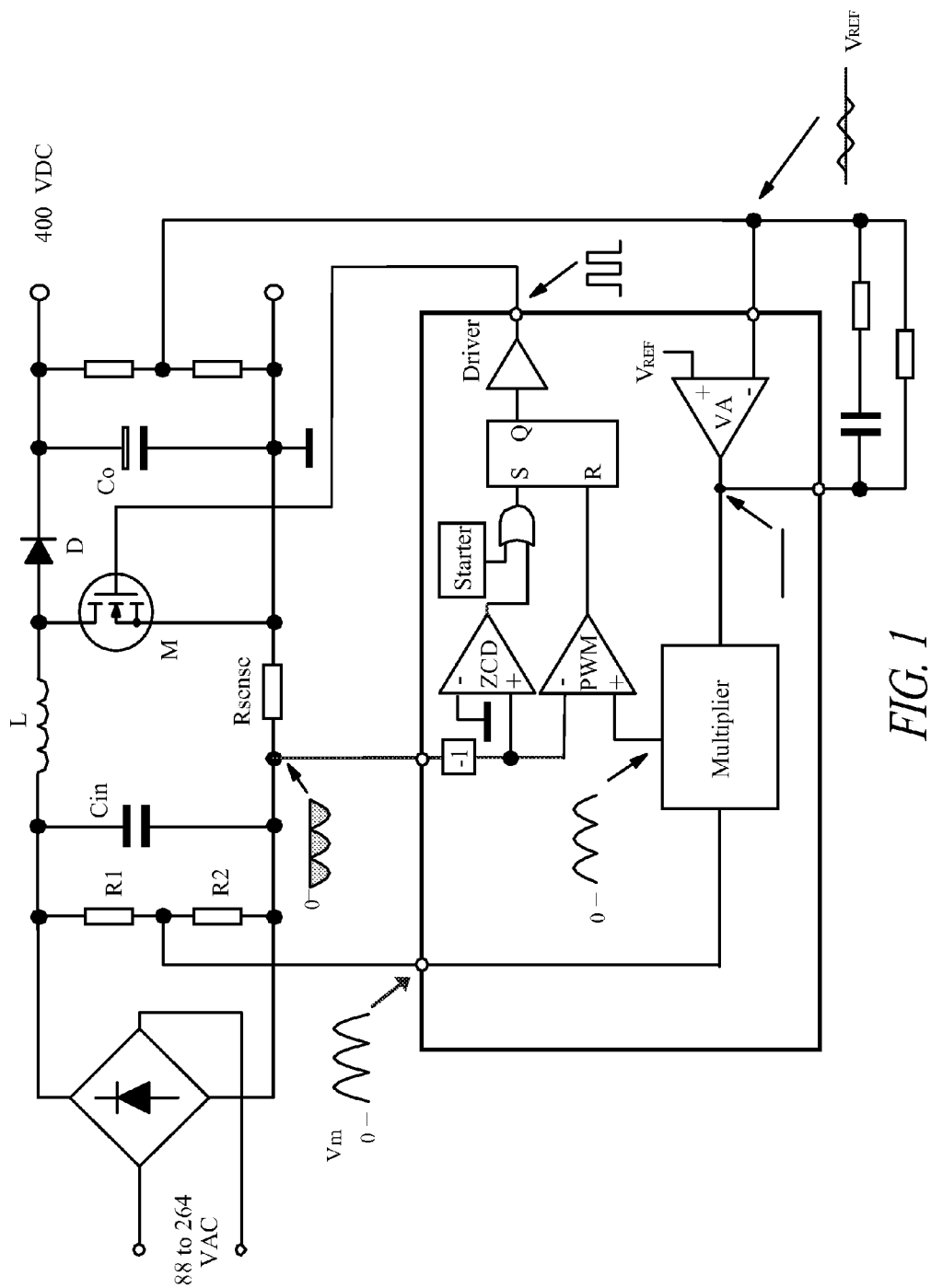
FIG. 1 shows a typical power factor correction system PFC with "transition mode" control.
Figure 2:
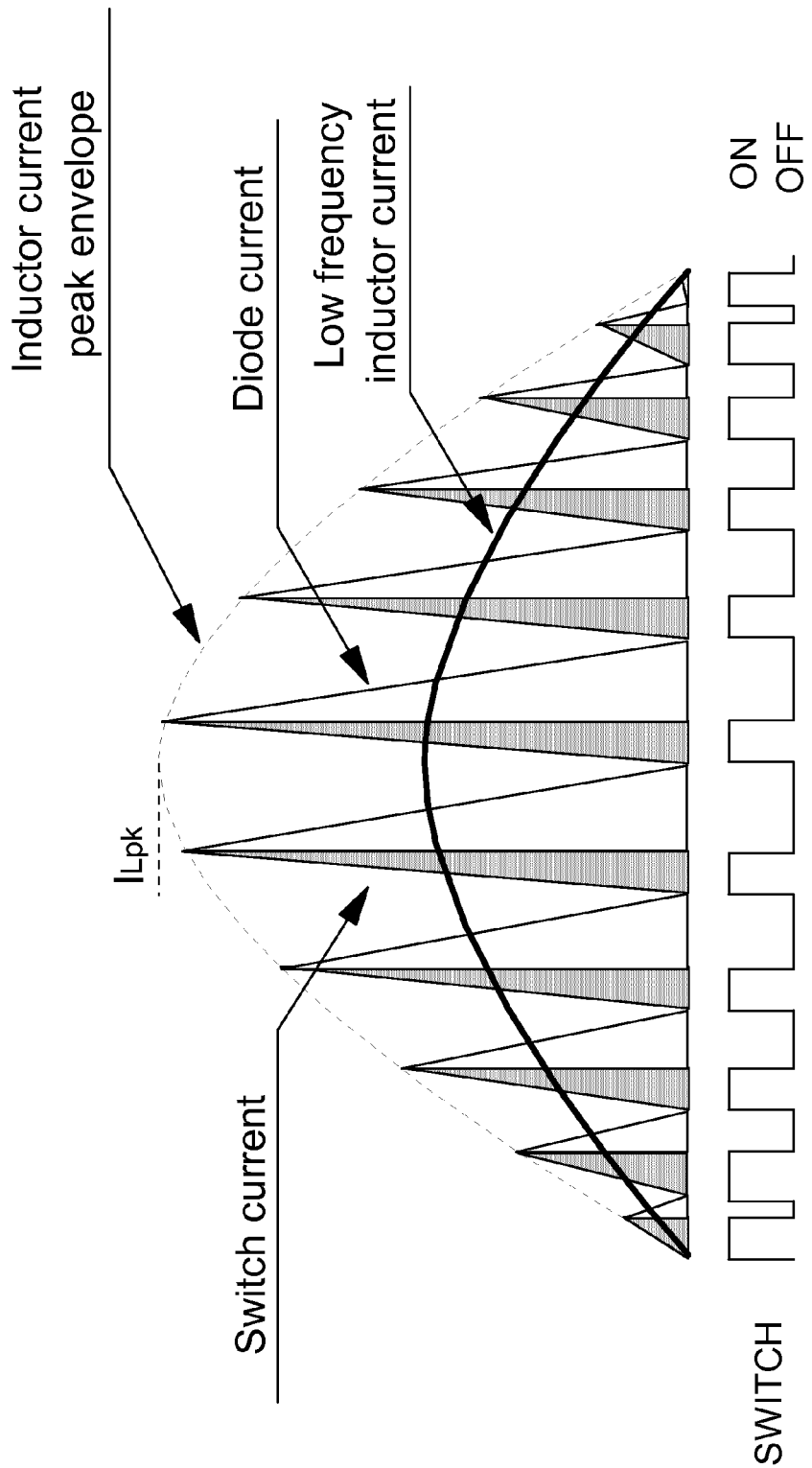
FIG. 2 is a time graph of the current flowing through components of the system of FIG. 1.
Figure 3:
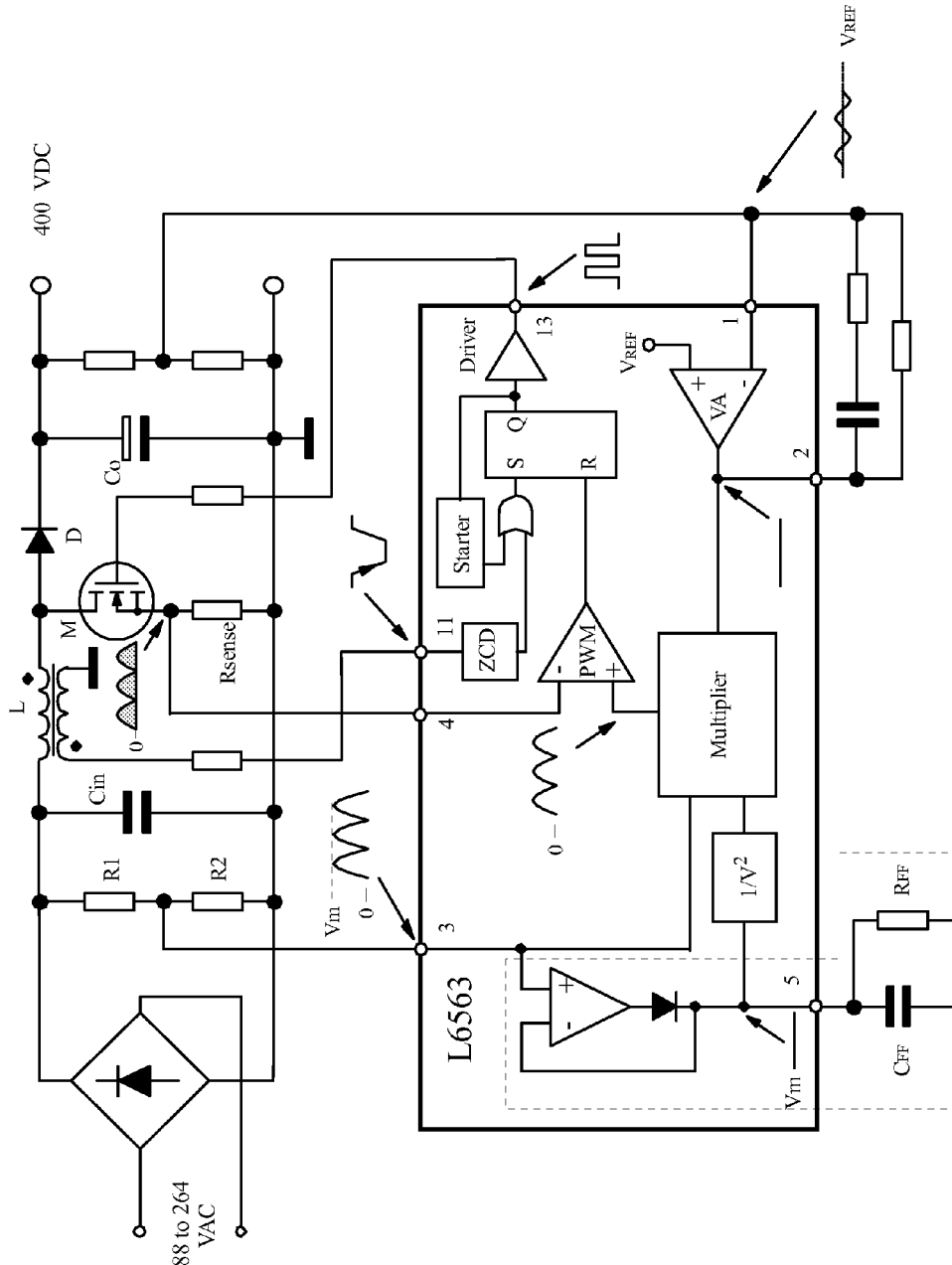
FIG. 3 shows elements of a PFC system that includes the detection structure of the peak voltage used in the known PFC L6563 of STMicroelectronics, disclosed also in U.S. Pat. No. 7,239,120.
Figure 4:
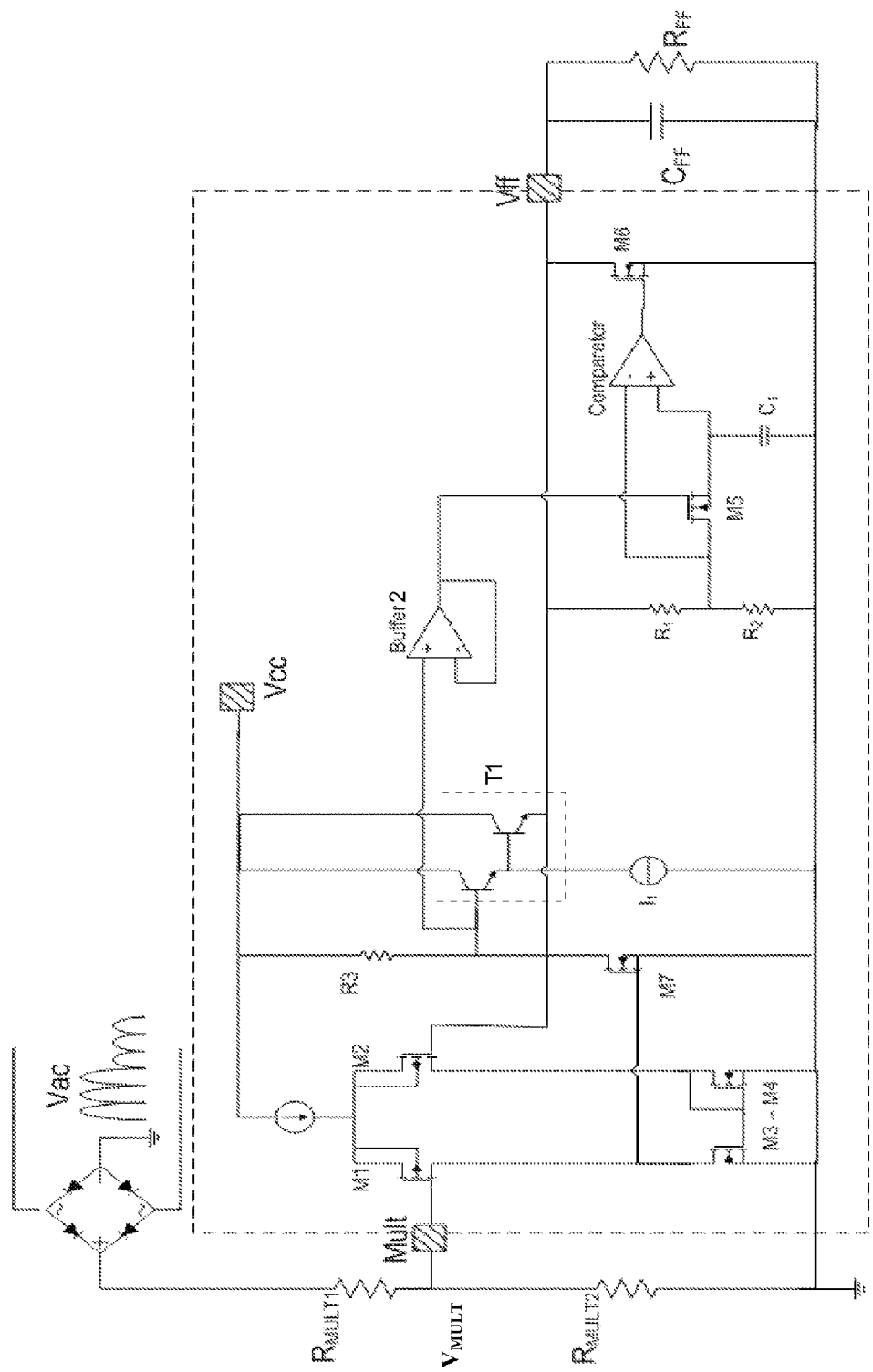
FIG. 4 shows elements of a PFC system that includes a mains drop detector used in the known PFC L6564 of STMicroelectronics.

The circuit of FIG. 4 is burdened by the drawback of using two external discrete components $R_{FF}$ and $C_{FF}$. Also, the activation time of the tracking mechanism (fast feedforward), tied to the constant $R_{FF}C_{FF}$ and to a fixed threshold, will further depend from the value of the peak voltage itself. Therefore, the higher the input voltage, the longer the time that will elapse before the threshold is surpassed, and thus the slower the system when following eventual abrupt variations of the oscillating voltage $V_{MULT}$.

One embodiment of the present disclosure provides an architecture realizable in a completely integrated form that implements a related method for detecting the peak voltage of low frequency oscillating signals, without requiring external discrete components and capable of following abrupt variations of the oscillating input voltage and of keeping constant with a good approximation the envelope voltage between two consecutive peaks, if they have substantially the same amplitude.

Figure 5:
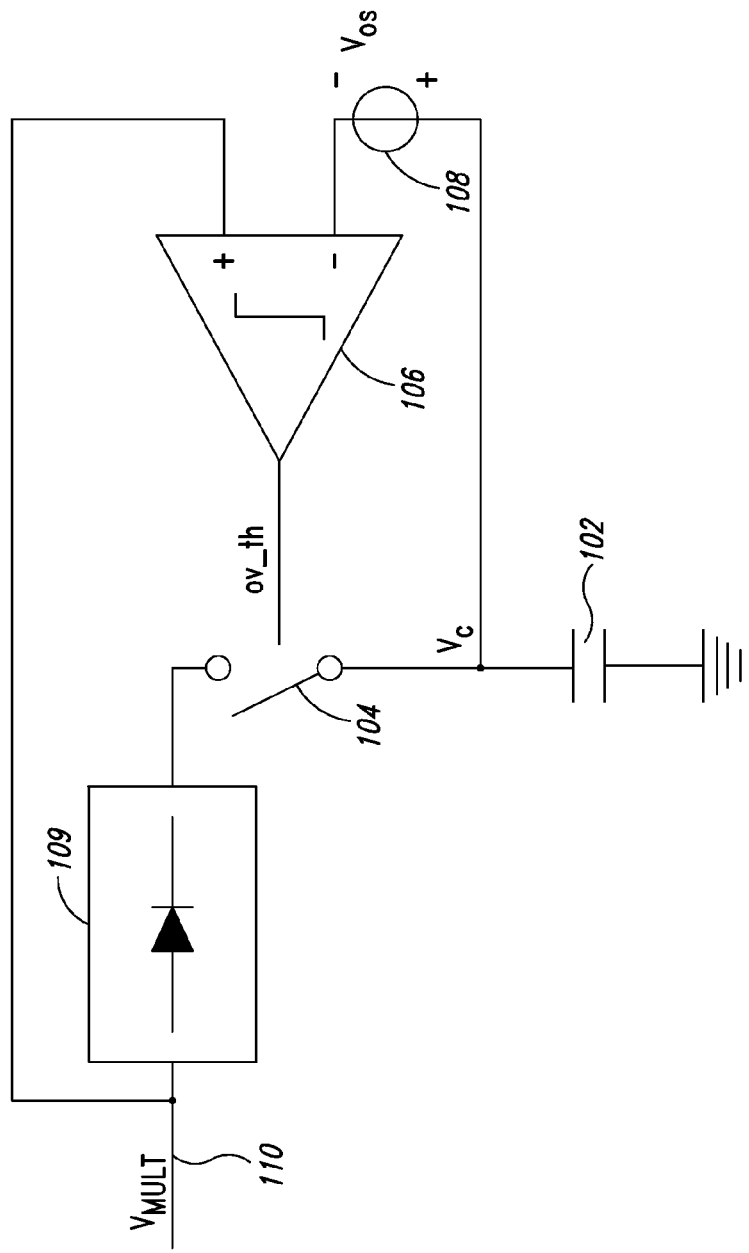
FIG. 5 shows a basic fully integrated architecture adapted to store the peak value of an oscillating voltage, according to an embodiment.
Figure 6:
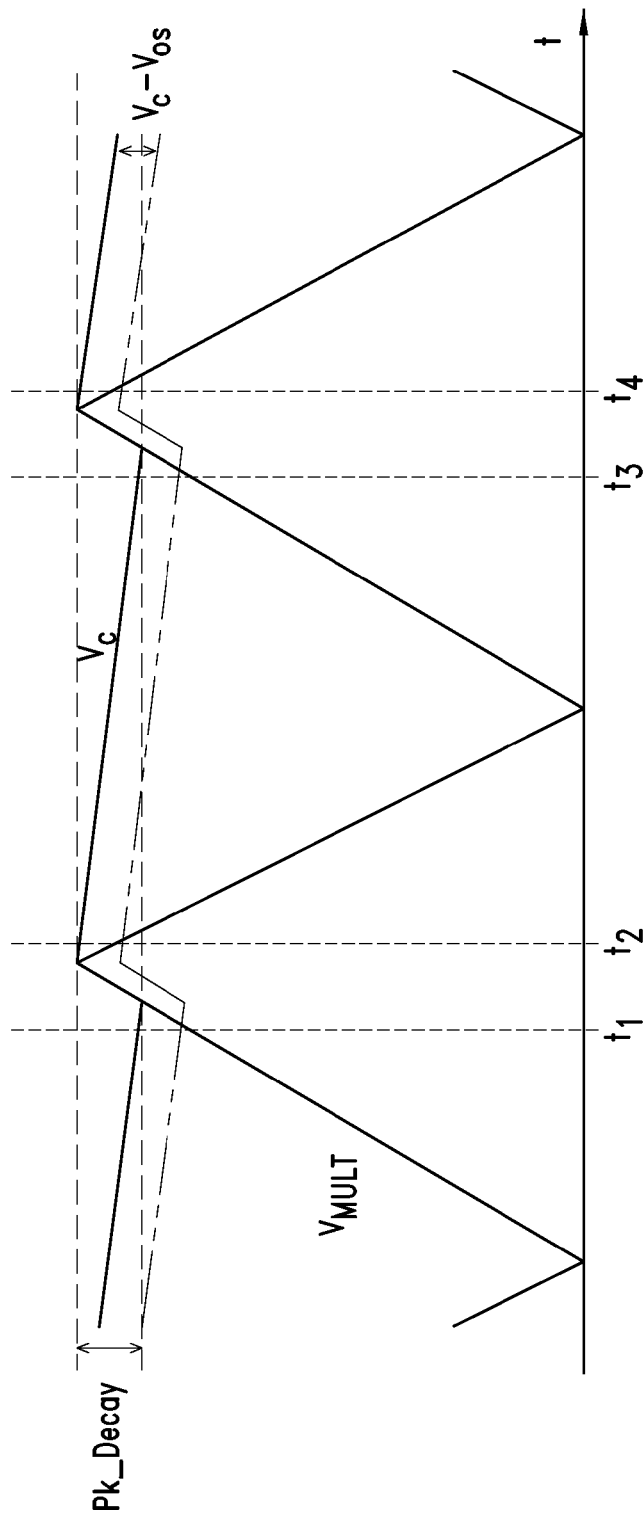
FIGS. 6 and 7 show exemplary time graphs of the envelope voltage of an oscillating voltage.

A peak detector 100 shown in FIG. 5 is based on the principle of isolating completely, through properly biased junctions, an integrated storage capacitance 102 between one peak value and the next. In this way, the drift of the stored datum between two consecutive peaks is reduced and the problem of controlling the discharge current of the capacitance is solved.

In prior art circuits, it is not possible to use an integrated capacitor with a controlled discharge. The integrated capacitors, because of limited silicon area occupation, are small and, if the storage times are in the order of milliseconds, the discharge current should be about one pA, thus hardly controllable with sufficient precision. The poor control of the value and even of the polarity of these currents (if the leakage phenomenon was exploited for discharging the capacitor $C_{FF}$) could cause a relevant variation of the stored information.

However, according to the embodiment of FIG. 5, between one voltage peak and the next, the integrated storage capacitance 102 is completely isolated by the switch 104 of FIG. 5, except for a connection to the comparator 106, which effectively has an infinite input (DC) impedance; in this way the previously detected voltage peak $V_C$ remains stored on the capacitor 102.

Figure 10:
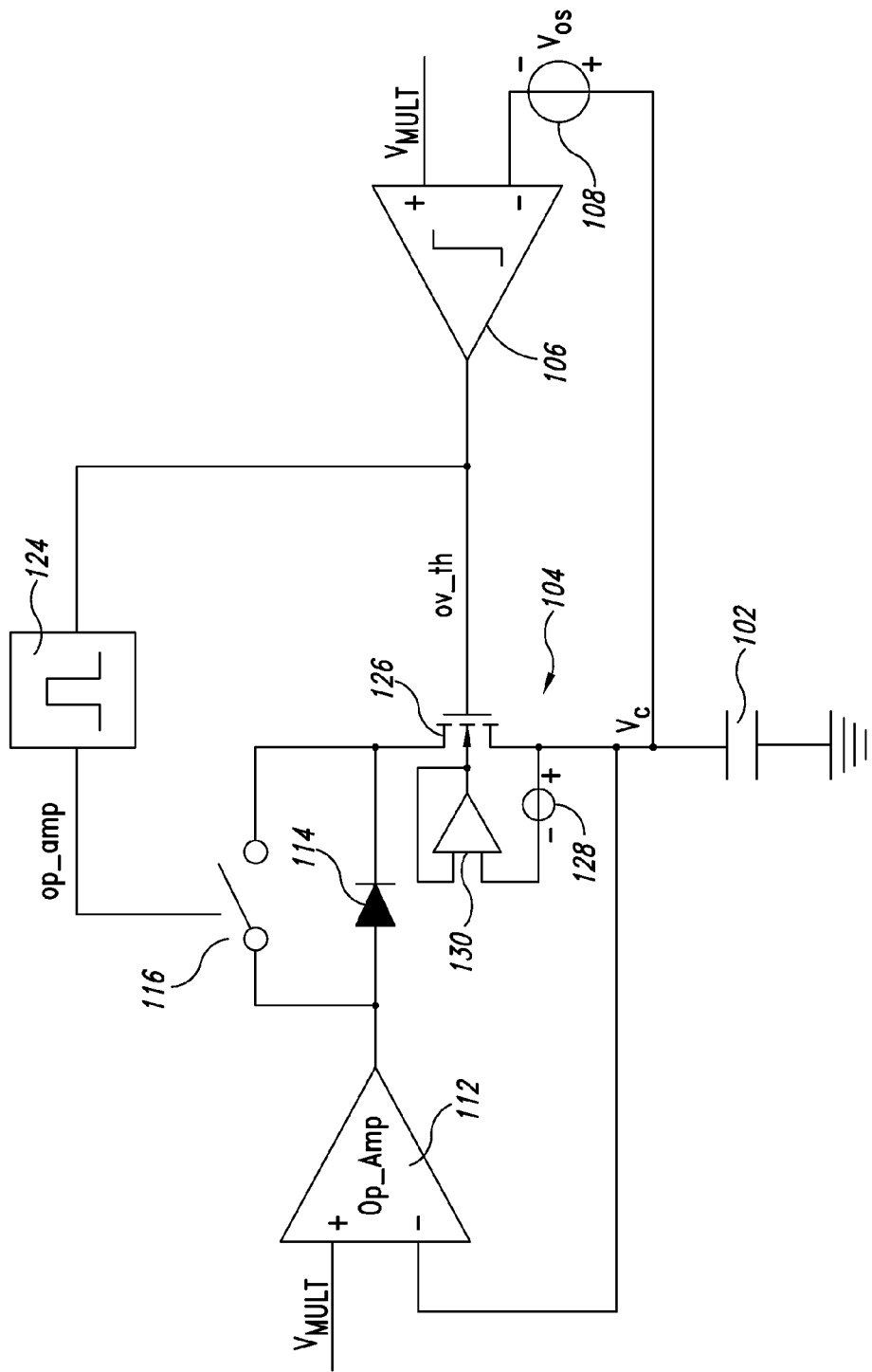
FIG. 10 shows a peak detector according to an alternative embodiment.

The switch 104, used for the isolation, can be optionally equipped with a circuit for reducing as much as possible leakage currents of the junction and thus the drift of the stored datum (FIG. 10).

An offset voltage source 108 is coupled between the storage capacitance 102 and a first input of the comparator 106. The offset voltage source 108 provides a selected offset voltage $V_{OS}$, which is subtracted from the voltage $V_C$ stored by the capacitor 102, and the resulting value ($V_C$–$V_{OS}$) is supplied at the first input of the comparator 106. An oscillating voltage signal $V_{MULT}$ that is proportional to a rectified power supply input is supplied at the second input of the comparator 106.

In addition, a rectifying circuit 109 is coupled between an input terminal 110, which receives the oscillating voltage ($V_{MULT}$), and a first conduction terminal of the switch 104 which has a second conduction terminal coupled to the capacitor 102. The rectifying circuit 109 is configured to generate a rectified replica voltage that is used to charge the capacitor 102 when the controlled switch 104 is closed and when the rectified replica voltage is greater than the voltage $V_C$ stored on the tank capacitor.

The switch 104 remains open as long as the input voltage $V_{MULT}$ does not reach a threshold value $V_C$–$V_{OS}$. As soon as the input voltage $V_{MULT}$ surpasses this value, the switch 104 is closed by a signal ov_th output by the comparator 106 and the capacitance 102 is connected to the remaining portion of the circuit and starts functioning as a classic detector, tracking the new peak value. The circuit remains in this configuration, with the switch closed, as long as the input voltage $V_{MULT}$ remains above the threshold voltage $V_C$–$V_{OS}$ (instant $t_2$ in FIG. 7).

With this technique the peak detector 100 is capable of detecting that a new peak value has been attained when it is greater than or equal to the previously stored value. Also, this technique does not require connecting the capacitor 102 longer than a time to store such a value. For the remaining part of the cycle, the capacitor 102 is practically isolated from the circuit and thus a minimum drift of the stored datum will occur, due only to leakage phenomena of the junction of the switch 104.

The described architecture works optimally in particular when the new peak value is close to or greater than the stored value and when it is possible to ensure that the leakage of the switch 104 tends only to discharge the capacitance 102.

If the leakage tends to store charges on the capacitance 102, bringing the stored voltage to drift towards greater values, the system can be equipped with a further circuit for refreshing, at each cycle, the value stored on the capacitance 102 itself.

An increasing drift of the stored voltage $V_C$ could indeed make the stored value (thus the threshold $V_C$–$V_{OS}$), if the peak does not change, after a certain number of cycles, to be too different from the next peak value without permitting the detection and the connection of the capacitance.

Figure 8:
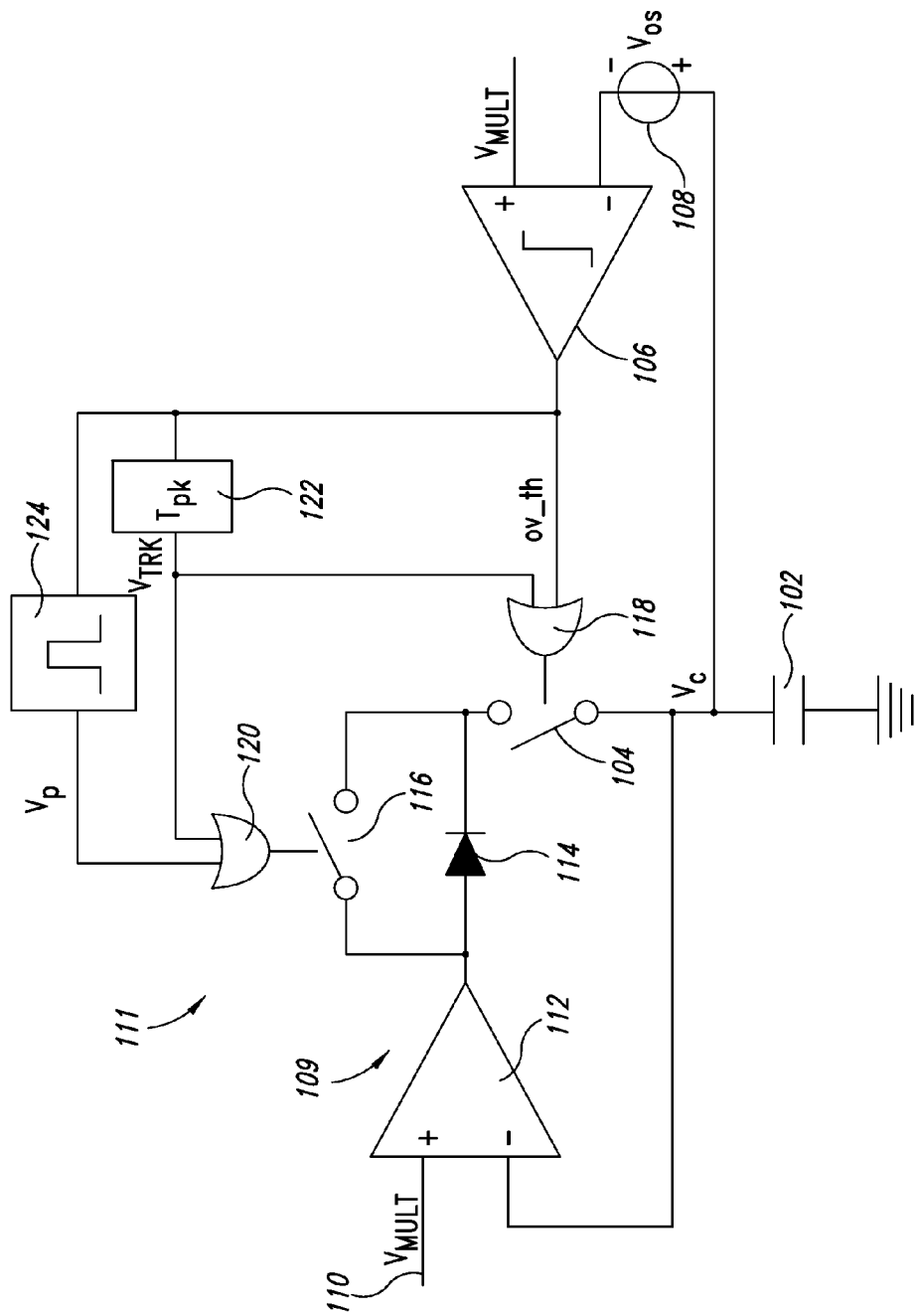
FIG. 8 shows a fully integrated peak detector of an oscillating voltage according to a further embodiment.

It is possible to obviate this limitation by using a further embodiment, as shown in FIG. 8. The peak detection circuit of FIG. 8 includes a clamping circuit 111 configured to clamp the envelope voltage $V_C$ to an instantaneous value of the oscillating voltage $V_{MULT}$. The clamping circuit 111 includes the rectifying circuit 109 implemented using an op-amp 112, a diode 114, and a switch 116. The op-amp 112 has a non-inverting input coupled to the input terminal that receives the oscillating signal $V_{MULT}$, an inverting input coupled to the second conduction terminal of the switch 104, and an output coupled to a cathode of the diode 114, which has an anode coupled to the first conduction terminal of the switch 104. The switch 116 is coupled in parallel to the diode 114 in order to bypass the diode when a control terminal of the switch 116 is activated.

The clamping circuit 111 also includes first and second OR gates 118, 120, a timer 122, and a monostable multivibrator (one-shot) 124. The first OR gate 118 has a first input coupled to the output of the comparator 106, a second input coupled to the output of the timer 122, and an output coupled to a control terminal of the switch 104. The timer 122 and one-shot 124 have respective inputs coupled to the output of the comparator 106 and respective outputs coupled respectively to first and second inputs of the second OR gate 120. The second OR gate has an output coupled to the control terminal of the switch 116.

According to this further embodiment, each time the comparator 106 detects the input voltage $V_{MULT}$ overcoming the threshold $V_C$–$V_{OS}$, besides closing the isolation switch 104 via the first OR gate 118, it causes the one-shot 124 to generate a pulse control signal (signal $V_P$ in FIG. 8) that closes the switch 116, bypassing the diode 114, which brings the peak detector to work as an operational amplifier closed in a buffer configuration (typically for about 40 μs). In this configuration, the charge stored in the previous period can discharge through the switches 104, 116 and the op-amp 112, and is thus nullified and in proximity of each peak value the stored value is refreshed.

Figure 7:
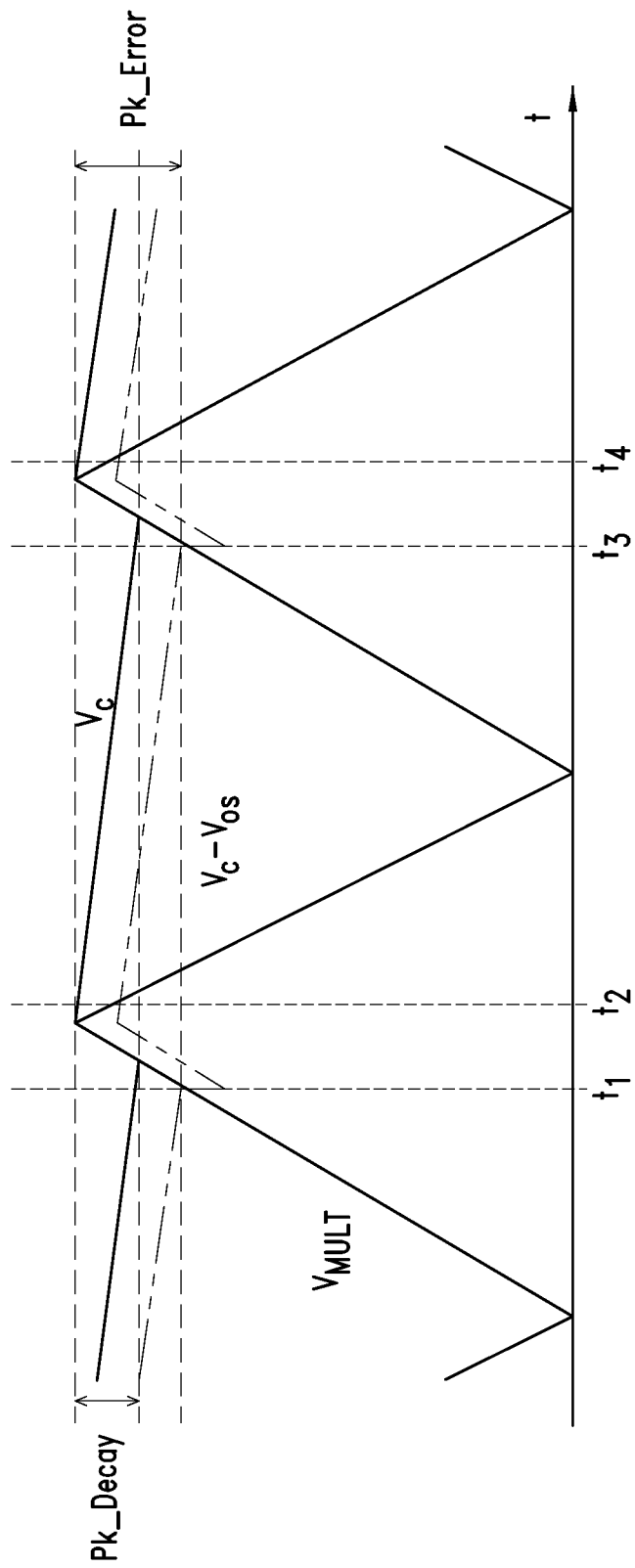

A drawback of this solution is the presence of a small ripple of the voltage $V_C$ at $t_3$ immediately before attaining the successive voltage peak, as shown in FIG. 7. Nevertheless, this ripple (equal to the offset voltage employed in detecting the peak itself) is controllable and may be made smaller than the ripple that is commonly present in detectors with external capacitance and controlled discharge:

$$Pk_{ERROR} = Pk_{DECAY} + V_{OS} \approx V_{OS}.$$

The error value $Pk_{DECAY}$ represents the drift of the voltage due to the leakage current of the switch that charges/discharges the storage capacitance and may be expressed as follows:

$$Pk_{DECAY} = \pm \frac{I_{LEAKAGE}}{C} \cdot \Delta T$$

In the case in which it is possible to fix the polarity of the leakage current, and in particular to make it discharge the capacitance 102, it is possible to remove the refreshing circuit and to use the simplified structure depicted in FIG. 10.

FIG. 8 also depicts a circuit that allows the system to track the mains voltage when abrupt reductions of the peak value occur.

If the oscillating input voltage $V_{MULT}$ of the peak detector does not attain the threshold value $V_C$–$V_{OS}$ within a pre-established period of time $T_{PK}$ (this happens, for example, when the new peak value is smaller than the previously stored value), the timer 122 generates a signal $V_{TRK}$ that closes the switch 116 via the second OR gate 116 and forces the system to work as an operational amplifier closed in a buffer configuration, for a short time (for example 40 μs) sufficient for the operational amplifier op-amp 114 to attain a steady state condition.

With this technique, the capacitance 102 is instantaneously brought to the present value of the input voltage and $V_C$ and $V_{MULT}$ thus are equal to each other.

At the end of this short time, the condition $V_{MULT} > V_C - V_{OS}$ is still verified and the capacitance 102 is still connected to the rest of the circuit that may continue working as voltage follower until the detection of the next peak.

Obviously, the time Tpk should be designed such to be slightly longer than the maximum period of the involved signals.

Figure 9:
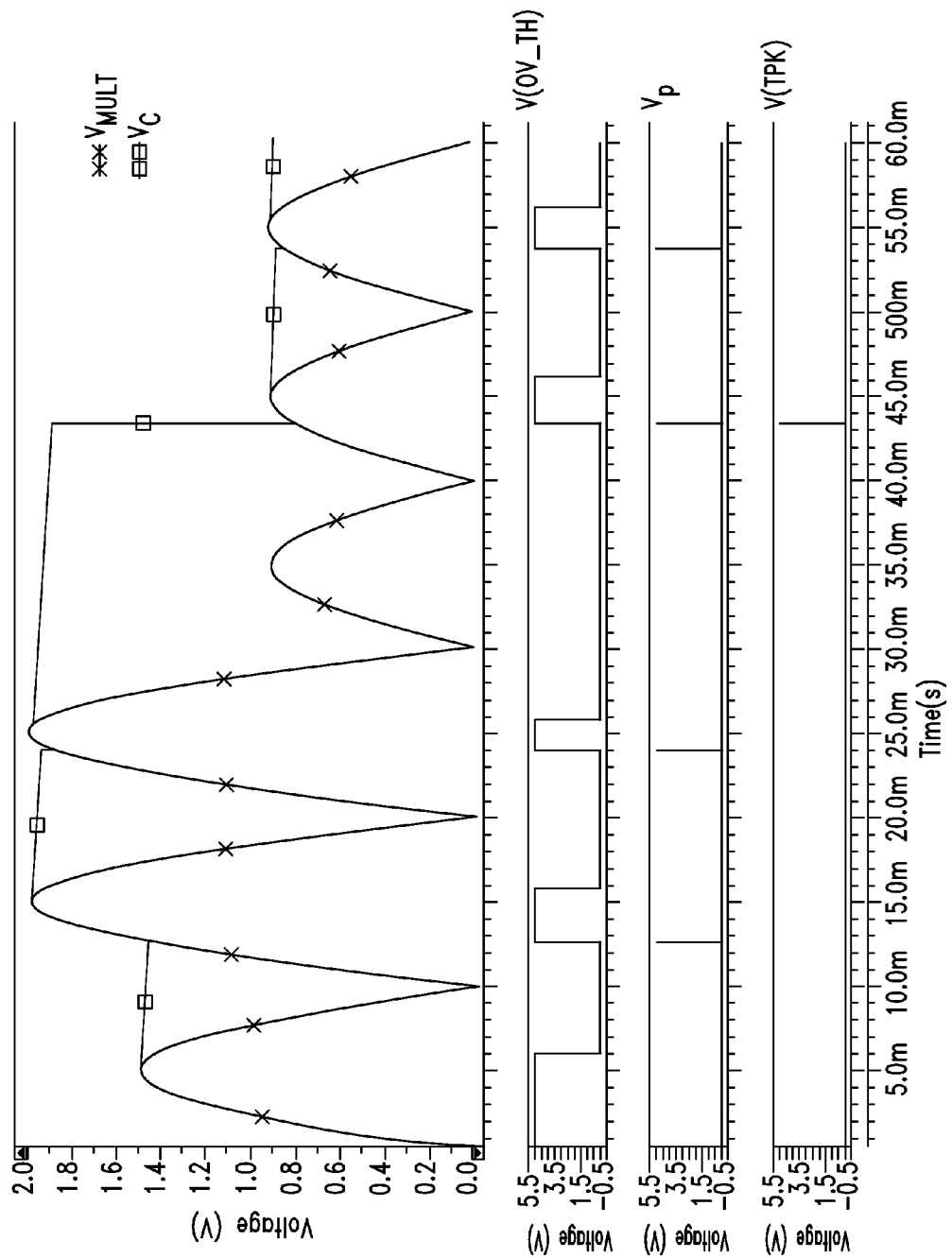
FIG. 9 shows time graphs obtained through simulation of the functioning of the peak detector of FIG. 8.

FIG. 9 shows simulation graphs of transient functioning of the circuit of FIG. 8. In particular, it is possible to notice that the peak value is tracked fast when it is greater than the previously stored value. The peak detector is capable of tracking the new value practically instantaneously.

In the case in which the peak voltage is smaller than the stored voltage, the circuit has a response time Tpk to make the circuit capable of tracking the input voltage and detecting a new peak value.

Besides the above considerations, if voltage peaks are to be detected when they are greater than a certain minimum threshold, according to an embodiment, at the end of the period Tpk, the circuit waits until the input voltage reaches a minimum enabling value before being configured as a voltage buffer.

By controlling the polarity of the leakage current, for example as shown in FIG. 10, it is possible to use the buffer configuration when tracking peak values smaller than the stored value. In FIG. 10, the switch 104 is implemented using a MOSFET transistor 126, an offset voltage source 128, and an op-amp 130 coupled to the body of the transistor 126 in a voltage follower configuration. The offset voltage source 128 supplies an input voltage to the op-amp 130 that is offset so as to be slightly below the value VC stored on the capacitor 102, which value is provided at the body terminal of the transistor 126 by the op-amp 130. Accordingly, any leakage current of the transistor 126 will tend to discharge the capacitor 102. Additionally, because the voltage difference between the body of the transistor 126 and the capacitor 102 is small, leakage current is likewise very small. In this way, the ripple on the output voltage, generated when the peak detector circuit is switched in a buffer configuration before each peak event, is avoided, and the overall ripple produced by the peak detector circuit is minimal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated detector, comprising:
a rectifying circuit, having an input and an output, configured to generate an rectified voltage at the output corresponding to an oscillating voltage at the input;
an integrated capacitor configured to store an envelope voltage representing a last detected peak value of the oscillating voltage;
a first switch configured to electrically couple said integrated capacitor to the output of the rectifying circuit when the first switch is closed, and to isolate the integrated capacitor from the rectifying circuit when the first switch is open; and
a comparator configured to compare the envelope voltage with the oscillating voltage, generate a command signal that closes said first switch in response to determining that a difference between the envelope voltage and the oscillating voltage is smaller than a first offset voltage, and keep the first switch open in response to determining that the difference is greater than the first offset voltage, wherein said first switch comprises:
a transistor; and
a voltage follower with offset, configured to keep a body voltage of said transistor offset from the envelope voltage on said integrated capacitor by a second offset voltage.

2. The detector of claim 1, comprising a clamping circuit configured to clamp said envelope voltage to an instantaneous value of the oscillating voltage, the clamping circuit including:
a timer configured to be enabled by an active switching edge of said command signal, and generate a pulse flag of a pre-established duration when a pre-established time has elapsed from said active switching edge; and
a logic element configured to close the first switch when said command signal is logically active or when said pulse flag is generated, and to open the first switch otherwise;
the rectifying circuit, which includes an op-amp and a diode; and
a second switch coupled in parallel to the diode and configured to be enabled by said pulse flag.

3. The detector of claim 1, comprising a clamping circuit configured to clamp said envelope voltage to an instantaneous value of the oscillating voltage, the clamping circuit including:
the rectifying circuit, which includes an op-amp and a diode;
a second switch coupled in parallel to the diode and configured to be activated, for a time interval, by an active switching edge of said command signal.

4. A device, comprising:
a peak detector circuit having:
a rectifying circuit, having an input and an output, configured to generate an rectified voltage at the output corresponding to an oscillating voltage at the input;
a capacitor;
a comparator having a first input coupled to a terminal of the capacitor and a second input coupled to an input of the peak detector, and configured to produce a command signal at an output of the comparator in response to determining that the difference of a voltage stored on the capacitor and the oscillating voltage is less than an offset voltage; and
a first switch positioned between the terminal of the capacitor and the output of the rectifying circuit and configured to couple the capacitor to the output of the rectifying circuit when closed, and to isolate the capacitor from the output of the rectifying circuit when open, the first switch being configured to close when the command signal is present at the output of the comparator and to open when the command signal is not present at the output of the comparator, wherein the first switch includes:
a transistor electrically coupled between the terminal of the capacitor and the output of the rectifying circuit and configured to couple the capacitor to the output of the rectifying circuit when the command signal is present at the output of the comparator; and
a voltage follower circuit configured to keep a body voltage of the transistor within a selected value relative to the voltage stored on the capacitor.

5. The device of claim 4, wherein the peak detector circuit, including the capacitor, is integrated on a semiconductor substrate.

6. The device of claim 4, wherein the peak detector circuit comprises a voltage offset circuit positioned between the terminal of the capacitor and the first input of the comparator and configured to supply the voltage corresponding to the voltage stored on the capacitor minus the offset voltage.

7. The device of claim 4, wherein the rectifying circuit comprises:
an op-amp having a first input electrically coupled to the input of the peak detector, a second input electrically coupled to the terminal of the capacitor, and an output; and
a diode electrically coupled between the output of the op-amp and the first switch.

8. The device of claim 7, wherein the rectifying circuit comprises a second switch positioned to bypass the diode when closed and enable the capacitor to discharge via the switches and the op-amp circuit.

9. The device of claim 8 wherein the peak detector circuit comprises a control circuit configured to control operation of the second switch to close for a selected duration when the comparator produces the command signal.

10. The device of claim 8 wherein the peak detector circuit comprises:
a timer circuit configured to determine elapsed time beginning each time the comparator produces the command signal, and to produce a flag pulse if the elapsed time from a most recent command signal exceeds a selected threshold;
a control circuit configured to control operation of the second switch to close for a selected duration when the timer circuit produces the flag pulse.

11. An integrated detector, comprising:
a rectifying circuit, having an input and an output, configured to generate an rectified voltage at the output corresponding to an oscillating voltage at the input;
an integrated capacitor configured to store an envelope voltage representing a last detected peak value of the oscillating voltage;
a first switch configured to electrically couple said integrated capacitor to the output of the rectifying circuit when the first switch is closed, and to isolate the integrated capacitor from the rectifying circuit when the first switch is open, wherein said first switch includes:
a transistor; and
a voltage follower with offset, configured to keep a body voltage of said transistor offset from the envelope voltage on said integrated capacitor by a second offset voltage; and
a comparator configured to compare the envelope voltage with the oscillating voltage, and to generate a command signal that closes said first switch when a difference between the envelope voltage and the oscillating voltage is smaller than a first offset voltage.

12. The detector of claim 11, comprising a clamping circuit configured to clamp said envelope voltage to an instantaneous value of the oscillating voltage, the clamping circuit including:
the rectifying circuit, which includes an op-amp and a diode;
a second switch coupled in parallel to the diode and configured to be activated, for a time interval, by an active switching edge of said command signal.

* * * * *